(12) United States Patent
Motakef et al.

(10) Patent No.: US 9,109,299 B1
(45) Date of Patent: Aug. 18, 2015

(54) SOLIDIFICATION OF HIGH QUALITY ALLOY SEMICONDUCTORS

(75) Inventors: Shariar Motakef, Weston, MA (US);
Piotr Becla, Arlington, MA (US);
Krzysztof Becla, Arlington, MA (US);
Matthew R. Overholt, Upton, MA (US)

(73) Assignee: CapeSym, Inc., Natick, MA (US)

( * ) Notice: Subject to any disclaimer, the term of this patent is extended or adjusted under 35 U.S.C. 154(b) by 1131 days.

(21) Appl. No.: 13/075,520

(22) Filed: Mar. 30, 2011

(51) Int. Cl.
*C30B 11/02* (2006.01)
*C30B 11/06* (2006.01)

(52) U.S. Cl.
CPC .............. *C30B 11/02* (2013.01); *C30B 11/06* (2013.01)

(58) Field of Classification Search
USPC ........................................ 117/81, 82, 83, 221
See application file for complete search history.

(56) References Cited

U.S. PATENT DOCUMENTS

| | | | | |
|---|---|---|---|---|
| 4,512,272 A * | 4/1985 | Landwehr | ...................... | 112/311 |
| 4,666,681 A * | 5/1987 | Ferrand et al. | ................ | 117/223 |
| 5,064,497 A * | 11/1991 | Clemans et al. | ................ | 117/81 |
| 5,932,005 A * | 8/1999 | Duffar et al. | .................... | 117/83 |
| 6,652,647 B2 * | 11/2003 | Duffar et al. | .................... | 117/81 |

* cited by examiner

*Primary Examiner* — Robert M Kunemund
(74) *Attorney, Agent, or Firm* — Modern Times Legal; Robert J. Sayre

(57) ABSTRACT

An alloy semiconductor can be grown using a container including a lower section containing a composition-control source material and an upper section containing a solid. The composition-control source material is heated to produce a vapor, and the solid charge is melted to form a melt with a melt meniscus extending to an inner surface of the container. The vaporized composition-control source material flows from the lower section to the upper and contacts the melt meniscus. The melt is then cooled to form a crystal.

28 Claims, 12 Drawing Sheets

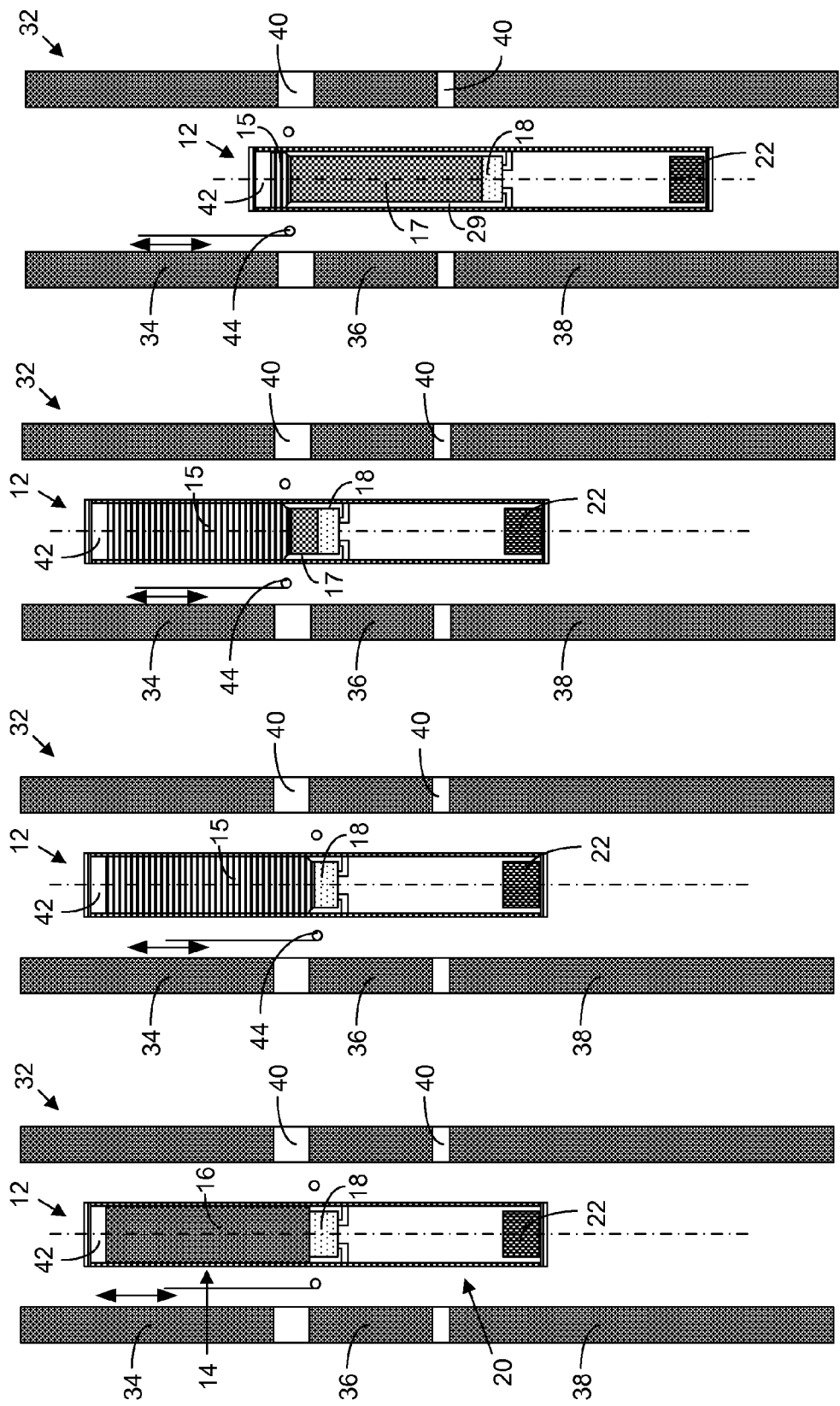

SOLIDIFICATION OF HIGH QUALITY ALLOY SEMICONDUCTORS

GOVERNMENT SUPPORT

The invention was supported, in whole or in part, by a grant, under contract number W9113M-C-0175, from the U.S. Missile Defense Agency. The Government has certain rights in the invention.

BACKGROUND

A known process for producing alloy semiconductor crystals is known as the Vertical Bridgman method, wherein an ampoule containing a solid charge is displaced in a furnace that has a temperature gradient. As the temperature of the furnace is increased, the charge is heated and then melts. The ampoule is then translated in the furnace such that the charge is directionally solidified. Alternatively, the ampoule may be stationary, and the furnace or the temperature field in the furnace may be translated relative to the ampoule resulting in directional solidification of the charge. Through judicious selection of the furnace temperature profile and translation rate, the solidified charge may be in the form of one or more single crystal grains. Vertical Bridgman is one of a number of directional solidification techniques for production of semiconductors contained in an ampoule; other techniques include Horizontal Bridgman, and Vertical or Horizontal Gradient Freeze.

The properties of semiconductor crystals produced by the standard directional solidification techniques are influenced by a number of innate features of the process. For example, as the solidification process is initiated from a fixed volume of the charge, any segregation of the melt constituents results in the enrichment or depletion of the melt from that constituent, which in turn results in axial variation of the concentration of that constituent in the solidified charge. Another feature of the standard Vertical Bridgman technique is the influence of containment on the quality of the grown material. The contact between the solidification interface and the ampoule wall results in generation of crystalline defects, such as dislocations. Spurious nucleation at the ampoule wall may also interfere with growth of large single crystal grains.

Elemental and alloy semiconductors produced by directional solidification all exhibit, to a varying extent, the issues described above. Directional solidification of materials that have a high vapor pressure is further complicated by the partial evaporation of the volatile material into the unavoidable open-space in the ampoule, which results in a deviation of the melt composition from desired stoichiometric conditions. In the case of alloys containing cadmium, such as CdTe and CdZnTe, changes in the melt stoichiometry due to a very small loss of cadmium can result in production of significant amount of tellurium precipitates in the grown material.

SUMMARY

Methods and apparatus for solidification of high-quality alloy semiconductors are described herein. Various embodiments of the device and method may include some or all of the elements, features and steps described below.

An alloy semiconductor can be grown using a container including a lower section containing a composition-control source material and an upper section containing a solid. The composition-control source material can include one or more of the major constituents of the semiconductor alloy or a dopant intended to be present at a low concentration in the alloy. The composition-control source material is heated and vaporized, and the solid charge is melted to form a melt with a solidification meniscus extending to an inner surface of the container. The vaporized composition-control material flows from the lower section to the upper and contacts the melt meniscus. The melt is then cooled to form a crystal.

In the methods described herein, the pressure generated by the evaporation of the composition-control material generates a pressure differential between the open space below the solidification meniscus and the space over the top of the melt column. This pressure difference maintains the solidification meniscus throughout the process of solidification of the molten charge. Further, in the methods described herein, the composition of the melt 15 that is about to be solidified can be controlled, and the melt composition can be different from that of other approaches where the vapor pressure in the volume over the top of the melt column was adjusted to control the melt composition; those other approaches influence the composition of the melt at the melt-top temperature, which differs from the solidification temperature of the melt. The accurate control of the melt composition at desired conditions just prior to solidification, as described herein, reduces the size and number (or density) of tellurium precipitates as well as the number of dislocations in the solidified crystal. The control of stoichiometry of the melt prior to solidification also increases the single crystal yield.

BRIEF DESCRIPTION OF THE DRAWINGS

FIG. 6 is a sectional illustration showing an ampoule in a furnace at the beginning of a process, where the solid charge, positioned above a seed, is in solid form, though the solid charge is aligned with the hot zone of the furnace to commence melting.

FIG. 7 is a sectional illustration showing the ampoule and furnace from FIG. 6 after the solid charge has melted and a solidification meniscus has formed.

FIG. 8 is a sectional illustration showing the ampoule and furnace from FIGS. 6 and 7 in an initial crystal-growth stage as the ampoule is lowered in the furnace the melt starts to crystallize above the seed.

FIG. 9 is a sectional illustration showing the ampoule and furnace from FIGS. 6-8 showing a final stage of the crystal growth, where most of the melt has crystallized.

In the accompanying drawings, like reference characters refer to the same or similar parts throughout the different views. The drawings are not necessarily to scale, emphasis instead being placed upon illustrating particular principles, discussed below.

DETAILED DESCRIPTION

Figure 1:
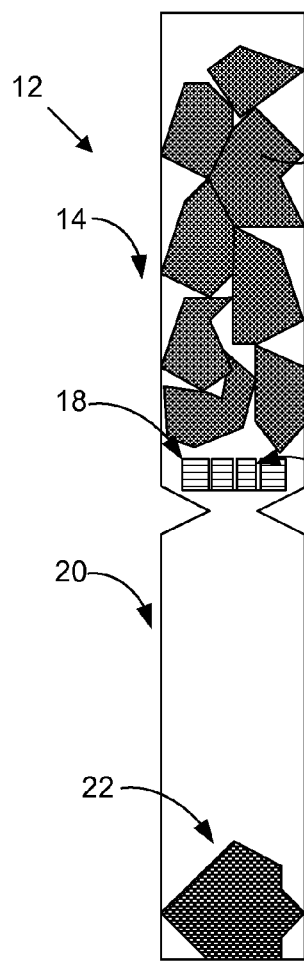
FIG. 1 is a schematic illustration of an ampoule filled with chunks of solid charge in an upper section and a composition-control source material in a lower section.

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Spatially relative terms, such as "above," "upper," "beneath," "below," "lower," and the like, may be used herein for ease of description to describe the relationship of one element to another element, as illustrated in the figures. It will be understood that the spatially relative terms may encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, the singular forms, "a," "an" and "the," are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

In the following methods, a liquid mixture can be solidified into single crystalline form, where the liquid mixture includes different elements from the periodic table, such as groups III and V, or groups II and VI. In particular embodiments of the method, a CdZnTe crystal is grown, where the concentration of zinc may vary from less than 1% to more than 50% by mole. The method can also be adapted to other materials.

The method can be characterized as a composition-controlled detached Bridgman method. As noted, above, in the standard Bridgman method for producing crystals, an ampoule containing a charge is displaced in a furnace with a temperature gradient to solidify a molten charge. In a "detached" Bridgman method, a pressure differential is established between the upper surface of the melt and meniscus region, resulting in detachment of the growing crystal from the ampoule in a vertical geometry. "Composition-controlled" detached growth, as that term is used herein, means that the composition of the melt is controlled at the solidification interface by controlling the supply of vapor diffused into the melt meniscus by controlling the release of the vapor from the composition-control source material.

Figure 2:
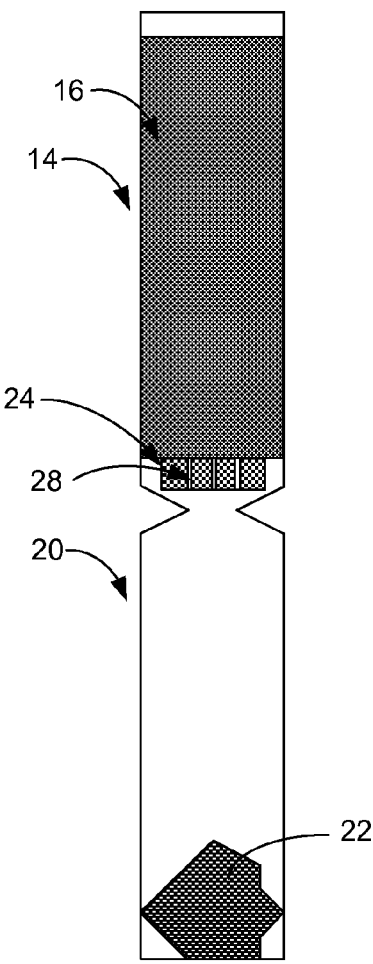
In FIG. 2 is a schematic illustration of an ampoule filled with a pre-fabricated solid charge in an upper section and composition-control source material in a lower section.
Figure 3:
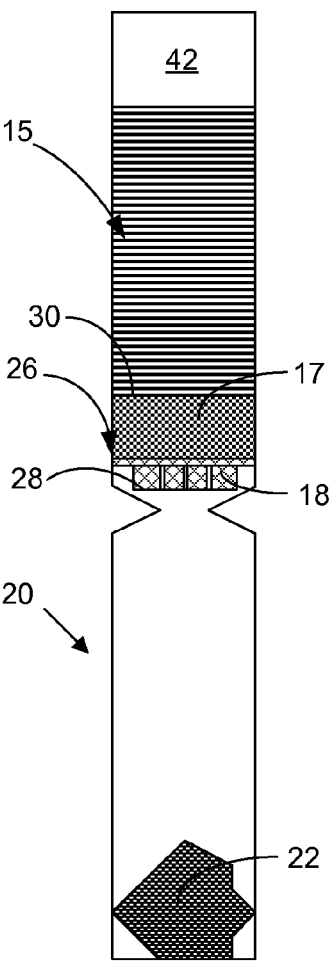
In FIG. 3 is a schematic illustration of an ampoule filled with a molten solid charge in an upper section and a composition-control source material in a lower section.

In one embodiment, the solidification of CdZnTe is conducted in a vertical container (e.g., ampoule) 12. The solid charge 16 is placed inside the ampoule 12; the ampoule 12 includes at least two sections, as shown in FIGS. 1-3, and can be formed of quartz. The upper section 14 of the ampoule 12 contains the solid charge 16, and a single CdZnTe crystal seed with a specific orientation can be placed under the solid charge 16. If the seed 18 is present, its diameter can be slightly smaller than the inner diameter of the ampoule 12. If a seed 18 is not present, a disk of purified graphite with a diameter smaller than the ampoule may be placed below the solid charge 16 in lieu of the seed 18.

In the embodiment of FIG. 2, the solid charge 16 is preformed into a cylindrical shape by, e.g., casting it into a cylinder with a diameter approximately equal to the diameter of the ampoule 12, with a small clearance to allow for insertion of the cylindrical solid charge 16 into the ampoule 12. In this embodiment of FIG. 2, a lower section 24 of the prefabricated solid charge 16 is machined to a smaller diameter, and the seed or disk of FIG. 1 can be omitted. Alternatively, in the embodiment of FIG. 3, a graphite disk or a seed 18 is placed below a pre-formed solid charge 16 of constant diameter (shown in a partially melted state 15 in FIG. 3). In the disk or seed 18 in FIGS. 1 and 3 or in the reduced-diameter lower section 24 of the solid charge 16 of FIG. 2, axial grooves 28 are cut on the periphery of the disk, seed or reduced-diameter lower section to allow direct communication between the gas volume in the lower section 20 of the apparatus and the free surface of the melt meniscus 26.

Figure 4:
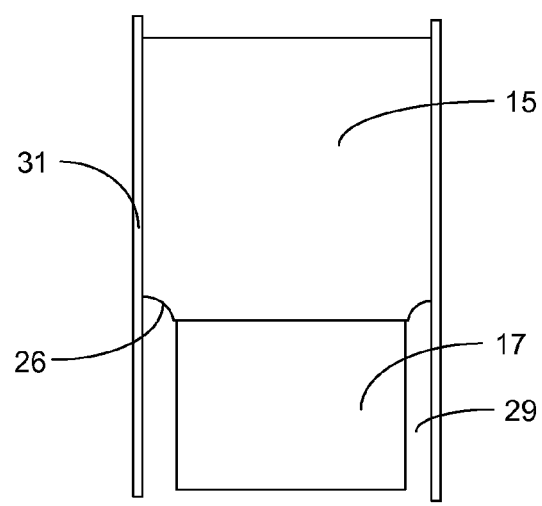
FIG. 4 is a sectional illustration showing the formation of a detachment meniscus with a free surface via a detached growth process.

An illustration of the detached melt meniscus 26 at the interface of the molten charge 15 and the solidified crystal 17 is provided in FIG. 4. As shown, a detachment gap 29 for vapor flow is provided between the formed crystal 17 and the wall 31 of the ampoule 12, and vapor from the cadmium source 22 can flow up from the lower section 20 around the crystal 17 to the meniscus 26, where the cadmium vapor can dissolve into the melt and shift the stoichiometry in the lower part of the melt 15.

As shown in FIGS. 1-3, the lower section 20 of the apparatus contains a cadmium (Cd) source 22. The cadmium source 22 may be pure cadmium, CdTe, or CdZnTe. Cadmium (or a cadmium alloy) is selected for the source 22 because, of the three melt constituents of cadmium, zinc (Zn) and tellurium (Te), cadmium has the highest partial pressure at elevated temperatures.

Figure 5:
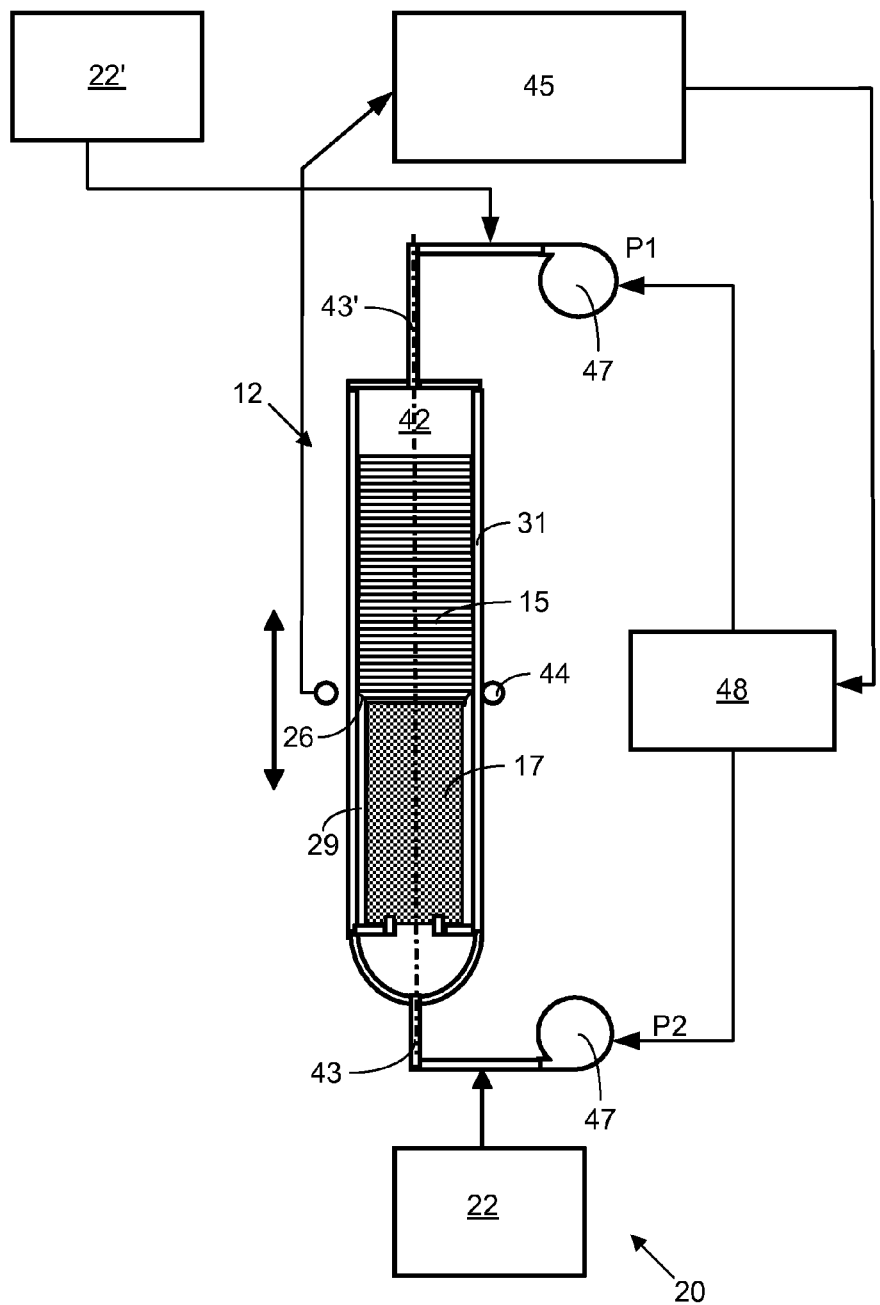
FIG. 5 is a sectional and schematic illustration showing an implementation for crystal growth from a melt with low vapor pressure, wherein the pressure above the melt top surface and below the solidification meniscus is actively controlled by a plumbing system connected to a vacuum and inert-gas pressure source(s) to which a dopant in vapor phase can be added.

The schematic illustration of FIG. 5 shows an embodiment of the apparatus for growth of a crystal 17 from a melt 15 with low vapor pressure, wherein the source 22 is outside the ampoule (but still considered to be inside the lower section 20 of the container 12, as the cadmium source 22 in fluid communication with the lower section of the ampoule), and the pressure in the open volume 42 above the melt top surface and in the passage 19 below the detachment meniscus 26 is actively controlled by a mechanically driven system including plumbing conduits 43 connected to pumps 47 and inert-gas pressure source(s) with a process controller 48. The process controller includes communication ports for sending and receiving information and a computer processor coupled with computer-readable memory storing non-transitory software code for governing the flow of inert gas and/or for controlling the temperature of the reservoir zone 38, as described below, in response to communications from electronics 45 coupled with the eddy current sensor 44.

The eddy current sensor 44 includes a thin metallic coil that surrounds the ampoule and is translated (displaced) periodically along the length of the ampoule. The eddy current coil along with the associated electronics detects the difference in the electrical conductivity of the solid and molten charge as the eddy current coil is translated along the region where solidification is taking place in the ampoule. Thus, the eddy current sensor 44 provides a signal on the location of the solidification front and communicates that signal to the process controller. The process controller uses the information on the location of the solidification front to calculate the remaining height of the molten charge and adjusts the pressure differential to accommodate for the change in the hydrostatic head of the molten charge during the solidification process. The hydrostatic head of the molten column is equal to the product of the density of the melt and the height of the melt column and the earth gravitational acceleration. As solidification proceeds, the pressure differential required to achieve detachment decreases as the hydrostatic head of the molten column decreases with decreasing height of the melt column. Consequently, the amount of vapor released from the composition-control source material (and the pressure or partial pressure thereof) can be decreased as crystallization proceeds (e.g., by decreasing the temperature to which the composition-control source material is heated).

In this embodiment, the lower section 20 of the apparatus includes a composition-control source material 22 coupled with the lower plumbing conduit 43 to supply a vapor of a metal that is either a primary melt constituent or a dopant (e.g., cadmium or indium) to the flow of inert gas in the conduit 43 into the ampoule 12 below the crystal 17 to alter the composition of a lower portion of the melt 15 with the chemical element that was vaporized at the desired concentration by controlling the concentration of dopant vapor and the pressure of the gas. A second dopant source 22' can likewise coupled with the upper conduit 43' to supply a chemical element (e.g., cadmium) in vapor phase to the flow of inert gas in the conduit 43 into the ampoule 12 above the melt 15 to dope an upper portion of the melt 15 with the chemical element that was vaporized at a desired concentration. By controlling the concentration of chemical element in the lower portion of the melt 15 at the solidification front where the melt 15 is crystallizing during growth, the chemical element can be uniformly incorporated throughout the produced crystal 17 (i.e., producing a uniform axial concentration of the chemical element in the crystal).

This uniform axial dopant incorporation overcomes a major problem in dopant distribution in crystals 17 produced by directional solidification. In standard solidification processes, the dopant is added to the solid charge 16 before it is melted. Thus at the beginning of the solidification process, the melt 15 has a uniform composition of the dopant. During solidification, segregation of the dopant at the solidification front is a well-known phenomenon that results in enrichment or depletion of the melt 15 from the dopant, depending on the segregation coefficient of the dopant in the grown crystal 17. Thus, as the dopant concentration of the solidified crystal 17 follows that of the melt 15, the dopant concentration in the crystal increases (or decreases) with increasing crystal length. Doping by the detached method can overcome this problem by keeping the melt composition constant during growth process (by controlling the heating and consequent vaporization of the composition-control source material) and can result in production of crystals 17 with substantially uniform composition.

As shown in FIG. 6, the ampoule 12 containing the solid charge 16 is inserted into a furnace 32 that includes a number of sections, each section containing one or more heaters capable of establishing a particular temperature profile. One section of the furnace 32 is designated as the "hot zone" 34, another as the "post-growth zone" 36, and a third as the "reservoir zone" 38. The reservoir zone 38 is the lower section of the furnace 32, on top of which the post-growth zone 36 is located. The hot zone 34, the hottest of the three zones, is placed on top of the post-growth zone 36. The zones 34, 36 and 38 can be separated from each other by separator zones 40 that include both thermally insulating and thermally conductive materials. The separator zones 40 functions to thermally isolate the zones 34, 36 and 38 and create axially varying temperatures between the zones 34, 36 and 38.

After the solid charge 16, seed 18 or graphite disk (if present) are placed in the upper section 14 of the ampoule 12 and the dopant source 22 has been placed in the lower section 20 of the ampoule 12 and the ampoule 12 is sealed either under vacuum or with a specific amount of injected inert gas, the ampoule 12 is loaded into the furnace 32, as shown in FIG. 6. The temperature of the three zones 34, 36 and 38 is increased gradually until (a) the temperature of the hot zone 34 exceeds the melting point temperature of the solid charge 16, (b) the temperature of the post-growth zone 36 reaches a value less than the melting point temperature of the solid charge 16, and (c) the temperature of the reservoir zone 38 reaches a value, e.g., in the range from 800-1000° C. during crystal growth for CdZnTe. With this temperature profile, the solid charge 16 melts down to a melt-back position 30 (shown in FIG. 3) in the ampoule 12 where the temperature of the solid charge 16 is above the melting point temperature.

Placing the cadmium source 22 in the reservoir zone 38 enables the generation of a high pressure of cadmium gas in the detachment gap 29 below the solidifying melt 15. As mentioned above, the diameter of the seed 18, graphite disk, or the lower section 24 of the pre-formed charge 16 is less than the inner diameter of the ampoule 12. On the peripheral surface of the seed 18, the graphite disk, or the lower section 24 of the pre-formed solid charge 16, axial grooves 28 are made to allow direct fluid communication between the cadmium reservoir in the lower section 20 of the ampoule 12 and the lower surface 26 of the molten charge 15 in the upper section 14.

When the solid charge 16 is melted back to the melt-back position 30, described above, the gas generated by the heating of the cadmium source 22 can reach the molten material 15 that forms a meniscus 26 bounded on one side by the seed 18, the graphite disk or the reduced-diameter lower section 24 of the pre-formed solid charge 16 and on the opposite side by the ampoule 12. The gas generated by the cadmium source 22 performs several functions that are beneficial to single-crystal growth of CdZnTe. First, by counteracting the hydrostatic head of the molten CdZnTe column 15, the pressure of cadmium gas vaporized from the source 22 helps maintain a meniscus 26 between the growth surface of the melt 15 and the wall of the ampoule 12. The gas generated by the cadmium source 22, when produced by controlling the temperature of the reservoir zone 38, causes the meniscus 26, which is initially formed during the melt back, to persist throughout most (if not all) of the growth process. Crystals 17 grown by this method have been found to have a very low dislocation density. The low values of dislocation density are related to the persistence of the melt meniscus 26 during the crystal growth, which inhibits contact between the solidified crystal 17 and the ampoule 12 and thereby reduces generation of defects, such as dislocations.

A second beneficial effect of the provision of composition-control vapor below the melt 15 is the direct control of the stoichiometry of the melt 15 very close to the growth interface. The composition of the molten charge 15 in the region immediately adjacent to the solidification front (i.e., the intersection of the melt 15 and the crystal 17) can be directly influenced by the value of the partial pressure of the cadmium gas at the free surface of the meniscus 26; the partial pressure of the cadmium gas at the meniscus free surface 26 is, in turn, controlled by the temperature of the reservoir zone 38 and by the pressure of the inert gas that may have been injected into the ampoule prior to the sealing of the ampoule.

By judicious selection of the temperature of the reservoir zone 38, a cadmium partial pressure that is equal to the cadmium partial pressure over the CdZnTe melt 15 at desired stoichiometric conditions is generated in the lower section 20. Specifically, raising the temperature of the reservoir zone 38 can increase the cadmium partial pressure in the lower section 20 of the ampoule 12. In this approach, any deviations from stoichiometric conditions in the charge 16, caused by weight-measurement accuracy limitations in the mixing of the solid charges or evaporation of cadmium from the melt 15 into the open volume 42 above the melt's top free surface, are corrected; and the melt 15 is solidified with a very accurately controlled composition to form the solidified crystal 17. This composition control significantly reduces the number and size of tellurium precipitates in the grown crystal relative to other Bridgman processes that do not posses this feature. After solidification as the crystal temperature is reduced, tellurium can precipitate into small aggregates with diameters ranging from sub-micrometer to several tens of micrometers. The presence of these precipitates is deleterious for performance of devices based on CdZnTe. We have shown that the number and size of tellurium precipitates can be significantly reduced through judicious selection of the temperature of the reservoir zone to optimize the composition of the melt prior to solidification.

The third advantage of the provision of the cadmium gas is to influence the concentration of electrical charge carriers in the solidified material. We have shown that n-type and p-type semiconductors can be grown at different temperatures of the reservoir zone. In additional embodiments, the composition-control source material includes a dopant that alters at least one of the electrical, mechanical, and optical properties of the solidified crystal. For example, where the crystal is CdZnTe or another II-VI alloy, the dopant can increase the electrical resistivity of the solidified crystal by compensating the unintentional impurities and intrinsic point defects in the crystal. Examples of the dopant include, for example, indium, chlorine, aluminum, iron and vanadium.

A fourth advantage of the provision of cadmium gas at the meniscus 26 from the lower section 20 of the ampoule 12 relates to the period after solidification of the melt 15 and the gradual reduction of the furnace temperature to room temperature. During this period, the crystal 17 undergoes in-situ annealing. Annealing is generally conducted by utilizing several temperature soaks at different temperature levels. Annealing the crystal 17 in the presence of cadmium vapor is known to result in reduction of the size and number of tellurium precipitates. In these methods, the temperature of the reservoir zone 38 can be controlled to achieve an optimal cadmium partial pressure over the solidified crystal 17 as to reduce the size and number of Te precipitates in the crystal 17.

In other embodiments, zinc or compounds of zinc can be used as the source material with or without the cadmium to compensate for the preferential incorporation of zinc from the melt into the solidifying charge (i.e., the segregation of zinc) and to help achieve axial uniformity in the zinc concentration of the produced semiconductor.

If a seed 18 is used, the melt-back position 30 can coincide with a point inside the seed 18, as shown in FIG. 7, so that part of the seed 18 is melted and the molten charge 15 is in contact with the seed material. If a seed 18 is not used and, instead, a graphite disk is used, then all of the solid charge 16 can be melted and the melting point temperature can be established somewhere along the thickness of the graphite disk—e.g., halfway across the thickness of the graphite disk. If neither a seed 18 nor a graphite disk are used and, instead, the cylindrical pre-formed solid charge 16 with a smaller diameter lower section 24 (as shown in FIG. 2) is used, the solid charge 16 can be melted down into the smaller-diameter section 24 of the pre-formed cylinder of solid charge 16—e.g., halfway through the thickness of the smaller-diameter section 24.

After a thermal soaking period ranging from a few minutes to several hours, growth of the crystal 17 is initiated by the relative displacement of the ampoule 12 with respect to the furnace 32, as shown in FIG. 8, such that the molten charge 15 is gradually lowered out of the hot zone 34.

The temperature of the lower section 20, acting as the cadmium reservoir during growth, can be in the range of 800-1000° C., depending on the desired stoichiometry of the melt 15. Crystals of exceptional qualities have been grown with the reservoir temperature in the range of 800-950° C.

Figure 10:
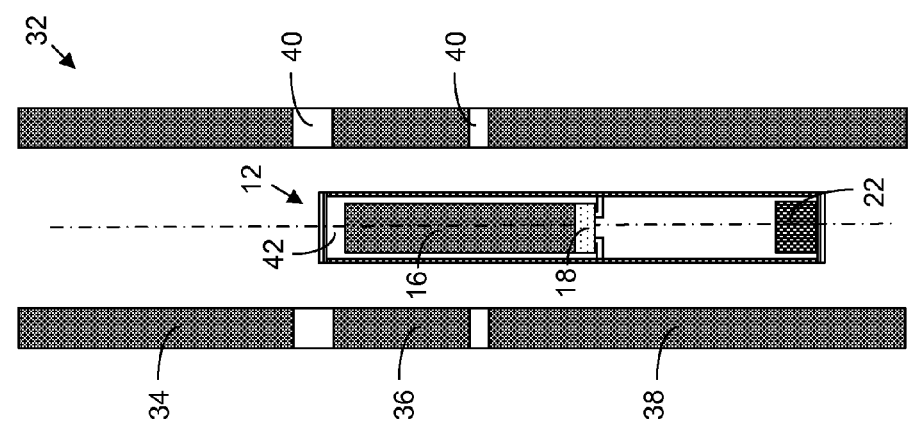
FIG. 10 is a sectional illustration showing the ampoule and furnace from FIGS. 6-9 further lowered in the furnace for post-growth cool down.

FIG. 9 shows a later stage in the crystallization process, as only a small volume of melt 15 remains over the crystal 17. Finally, as shown in FIG. 10, the ampoule 12 is further lowered in the furnace after full crystallization for a post-growth cool down. In this post-growth cool down, the temperatures of the hot zone 34 and post-growth zone 36 are gradually decreased until they are equal to the temperature of the reservoir zone 38. The temperature of all furnace zones 34, 36 and 38 is then reduced over a period ranging from 4 to 48 hours to a value that results in the temperature of the crystal 17 being 700° C. The crystal 17 is then kept at this temperature for a time period ranging from 24-72 hours. The temperature of the furnace zones 34, 36 and 38 is then reduced over a time period ranging from 24 to 48 hours to a value that results in a crystal temperature of 400° C. The crystal 17 is then maintained at this temperature over a period of time ranging from 48 to 96 hours. The crystal 17 is then cooled to room temperature over 24 hours.

Figure 12:
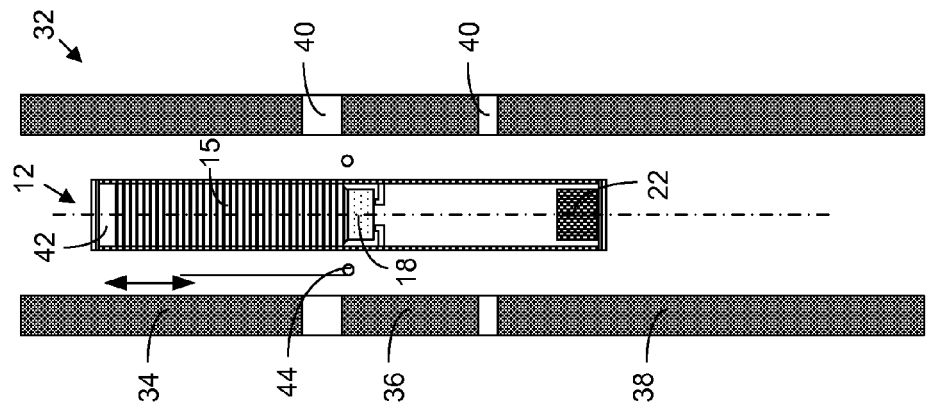
FIG. 12 is a sectional illustration showing the ampoule and furnace from FIG. 11 after the upper portion of the solid charge has been melted.
Figure 11:
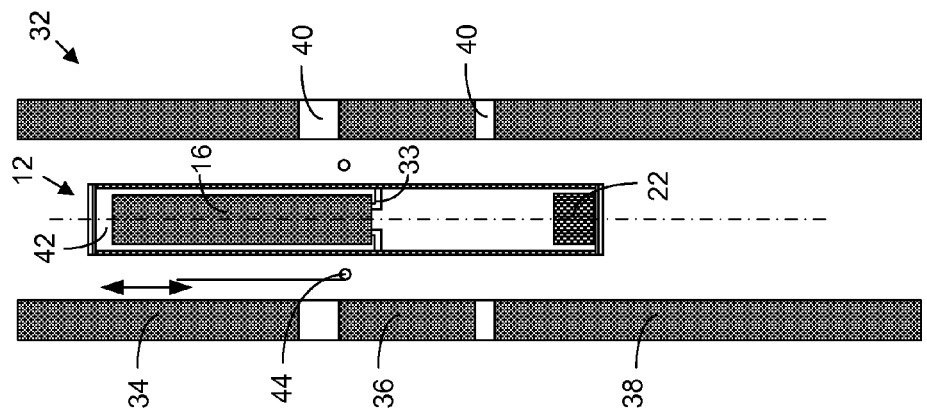
FIG. 11 is a sectional illustration showing an ampoule and furnace, wherein the solid charge is only partially melted, and its lower portion is positioned below the hot zone and remains solid to serve as the "seed."

In an alternative embodiment, shown in FIG. 11, the seed is omitted and, instead, the solid charge 16 is mounted directly on the narrowed neck portion 33 of the ampoule 12, wherein the solid charge 16 is only partially melted. In this case, lower portion of the solid charge 16 is positioned below the hot zone 34 in the furnace 32 and remains solid to perform the same function as the seed 18 did in previous embodiments—i.e., to initiate crystal growth from the molten charge 15, as shown in FIG. 12.

Figure 13:
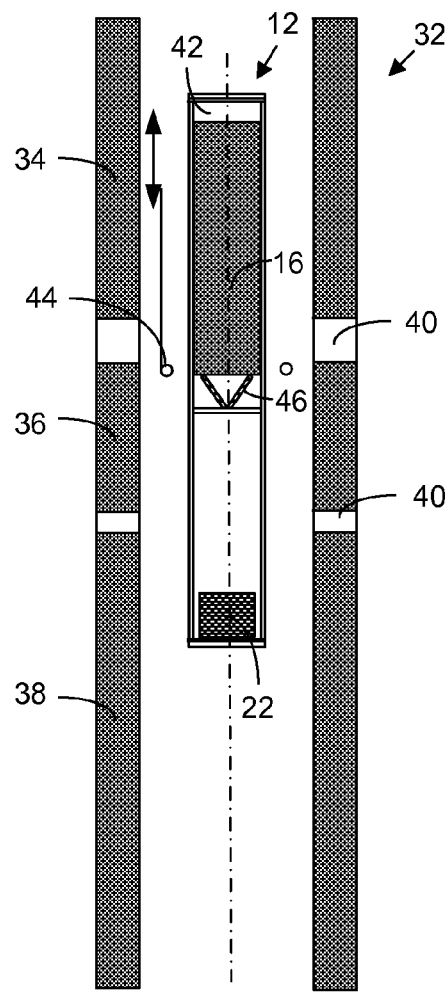
FIG. 13 is a sectional illustration showing an ampoule and furnace, wherein no seed is provided; instead, a conical support extends close to the inner diameter of the ampoule, separated from the ampoule by a small distance that will serve as the detachment gap.

Likewise, the embodiment of FIG. 13 also omits the seed from the ampoule 12. Instead, a conical support 46 extends close to the inner diameter of the ampoule 12, separated from the wall of the ampoule 12 by a small distance that will serve as the detachment gap 29. Crystal growth using this coned-ampoule geometry combines the advantages of detached growth with the superior single crystal yield of growth from a superheated melt.

Figure 14:
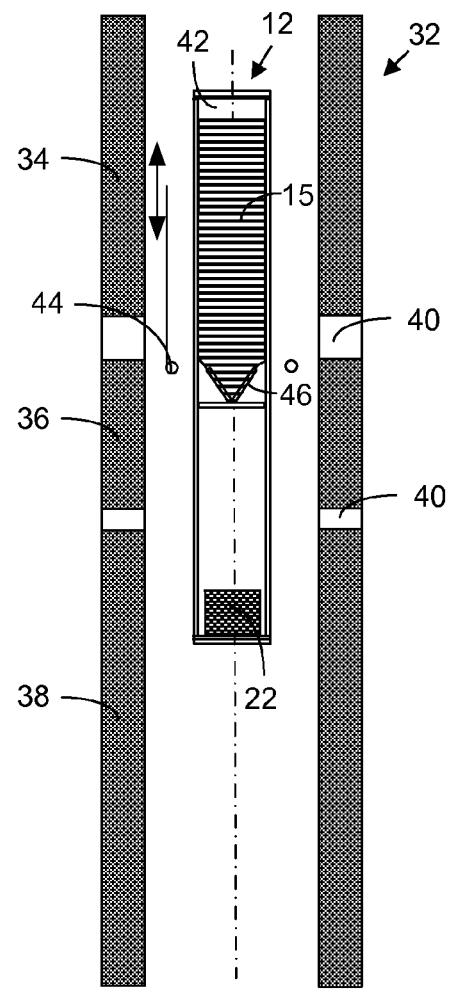
FIG. 14 is a sectional illustration showing the ampoule and furnace from FIG. 13 after the solid charge has melted; some of the melt has flowed into the conical support, and a solidification gap is created. Growth is initiated from the inside of the cone, in contact with the cone. Once the crystal grows out of the cone, then it grows detached from the ampoule wall.

After the solid charge 16 has melted, as shown in FIG. 14, some of the melt 15 flows into the conical support 46; and a detachment gap 29 is created. Here, once the CdZnTe charge 16 is melted, the melt 15 fills up the lower conical support 46; and the surface tension of the melt 15 and the pressure below the cone 46 help maintain a meniscus between the melt 15 in the cone 46 and the melt column above the cone 46. The CdZnTe melt 15 is heated by more than 20-30 degrees Celsius above its melting point before the ampoule 12 is lowered in the furnace 32 to initiate crystal growth at the lower tip of the cone 46. The melt temperature at the cone tip generally is 20-30 degrees Celsius below the solidification temperature before crystal growth initiates inside the cone 46 and in contact with the cone 46. At that point, the temperature of a certain portion of the melt 15 above the cone tip is at or below the solidification temperature, resulting in rapid advance of the solidification interface.

Once the crystal 17 grows out of the cone 46, the crystal 17 then grows detached from the wall of the ampoule 12, separated by the detachment gap 29. Experimental results have shown that superheating of the melt 15 followed by rapid crystallization of the sub-cooled melt results in production of single crystal grains that are appreciably larger than grains obtained when the melt 15 was not superheated. In this embodiment, the rapid solidification of the molten charge 15 is followed by detached and composition-controlled growth, achieving production of large CdZnTe grains with superior material properties described herein.

Figure 15:
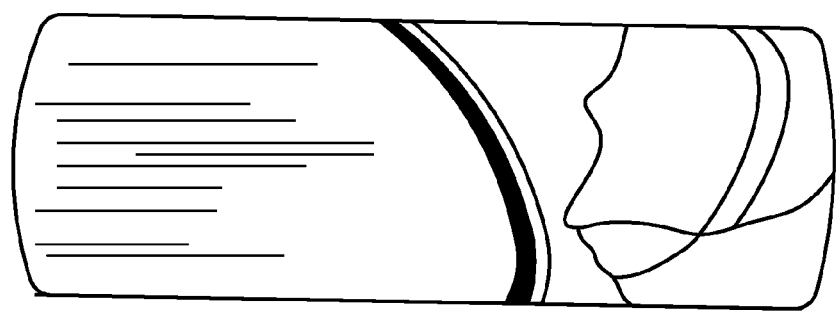
FIG. 15 is a photographic image of a composition-controlled CdZnTe crystal with a diameter of 51 mm grown by a composition-controlled detached Bridgman method of this disclosure, wherein the crystal has a much higher single crystal yield (i.e., the single crystal grains are larger) than conventionally grown crystals.
Figure 16:
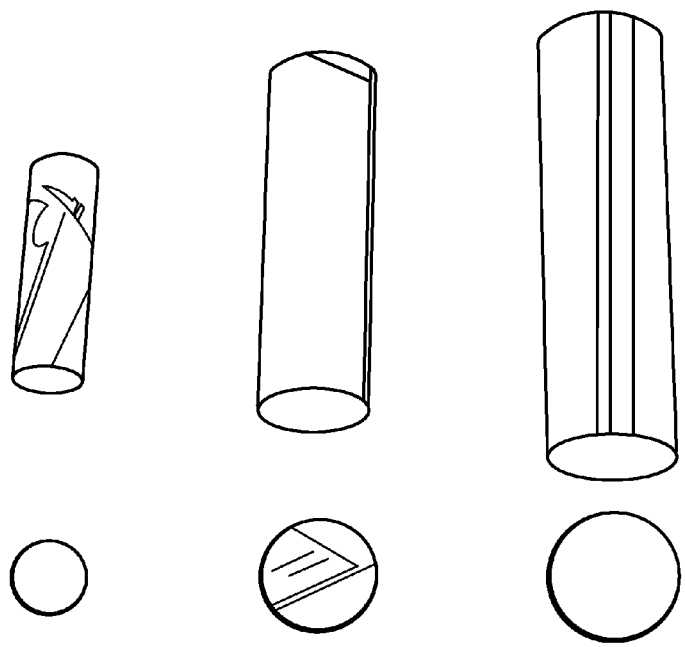
FIG. 16 is a photographic image of CdZnTe crystals with diameters of 16 mm, 24 mm and 28 mm (left-to-right) grown by the detached Bridgeman method.

A photographic image of a CdZnTe crystal with a diameter of 51 mm grown by a composition-controlled detached Bridgman method of this disclosure is provided as FIG. 15. Additionally, a photographic image of CdZnTe crystals with diameters of 16 mm, 24 mm and 28 mm (left-to-right) grown by the composition-controlled detached Bridgman method of this disclosure is provided as FIG. 16. These crystals were grown with the ampoule configuration of FIGS. 6-10.

Figure 17:
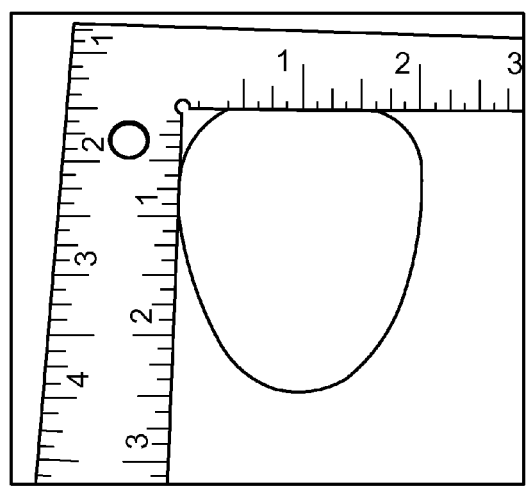
FIG. 17 is a photographic image of an infra-red substrate fabricated from a grown CdZnTe crystal.
Figure 18:
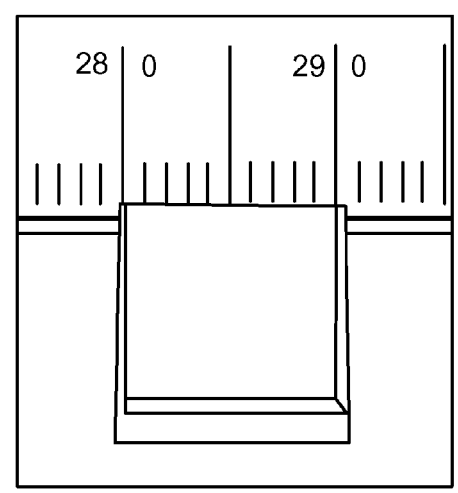
FIG. 18 is a photographic image of a radiation detector fabricated from a grown CdZnTe crystal, wherein the radiation detector can detect x-, $\alpha$-, and $\gamma$-rays.

Moreover, a photographic image of an infra-red substrate fabricated from the CdZnTe crystal grown by these methods is provided as FIG. 17. This substrate was fabricated by orientating the crystal shown in FIG. 15 relative to the cutting direction of a diamond wire saw to produce a substrate with the desired <111> orientation. Additionally, a photographic image of a radiation detector fabricated from a CdZnTe crystal grown by these methods is provided as FIG. 18. This radiation detector was cut by a diamond wire saw, as described above. The cut sample was polished and chemically treated before gold contacts were applied to two parallel sides of the detector. This radiation detector can be paired with appropriate signal processing electronics to detect x-, $\alpha$-, and $\gamma$-rays.

Figure 19:
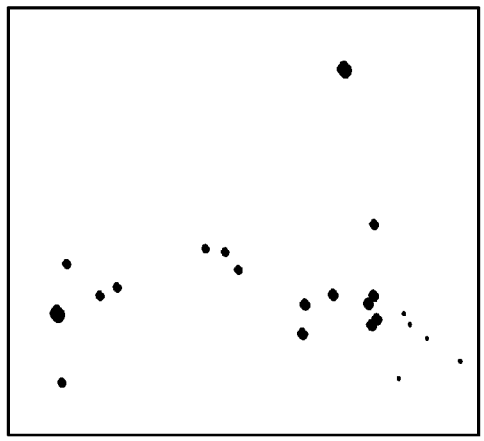
FIGS. 19 and 20 are photographic images of etched pits in a composition-controlled detached crystal grown with a detached Bridgman method, wherein the etch pit density is a measure of dislocation density in the crystal and reflects the extent of crystalline defect and disorder in the crystal.
Figure 20:
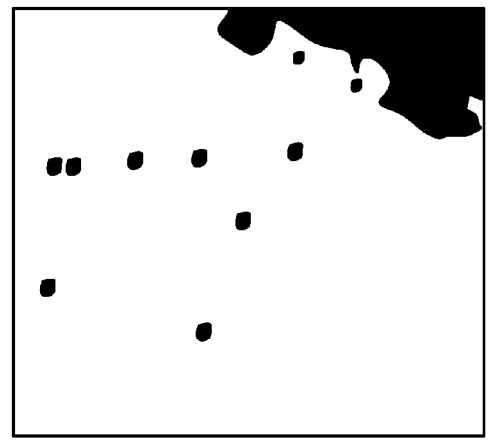
Figure 21:
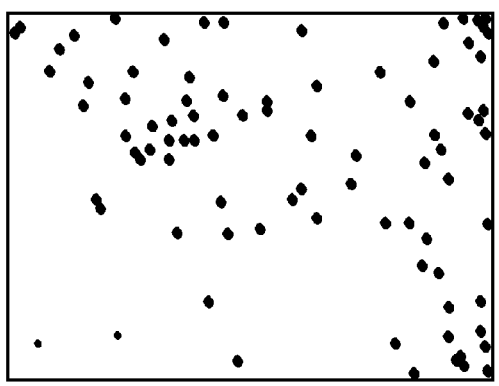
FIGS. 21 and 22 are photographic images of etched pits in a crystal grown by the conventional Vertical Bridgman method, wherein the etch pit density in this crystal is significantly higher than that of the crystal grown by the composition-controlled detached Bridgman method.
Figure 22:
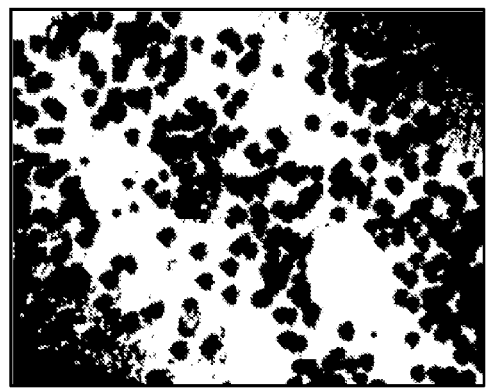

The photographic images of FIGS. 19 and 20 show etched pits (dark spots) in a composition-controlled detached crystal grown with a method of this disclosure, wherein the etch pit density is a measure of dislocation density in the crystal and reflects the extent of crystalline defect and disorder in the crystal. For comparison, photographic images of etched pits in a crystal grown by the conventional Bridgman method (i.e. without composition-controlled detachment) are provided as FIGS. 21 and 22, wherein the etch pit density in this crystal is significantly higher than that of the crystal grown by a composition-controlled detached Bridgman method of this disclosure.

Figure 23:
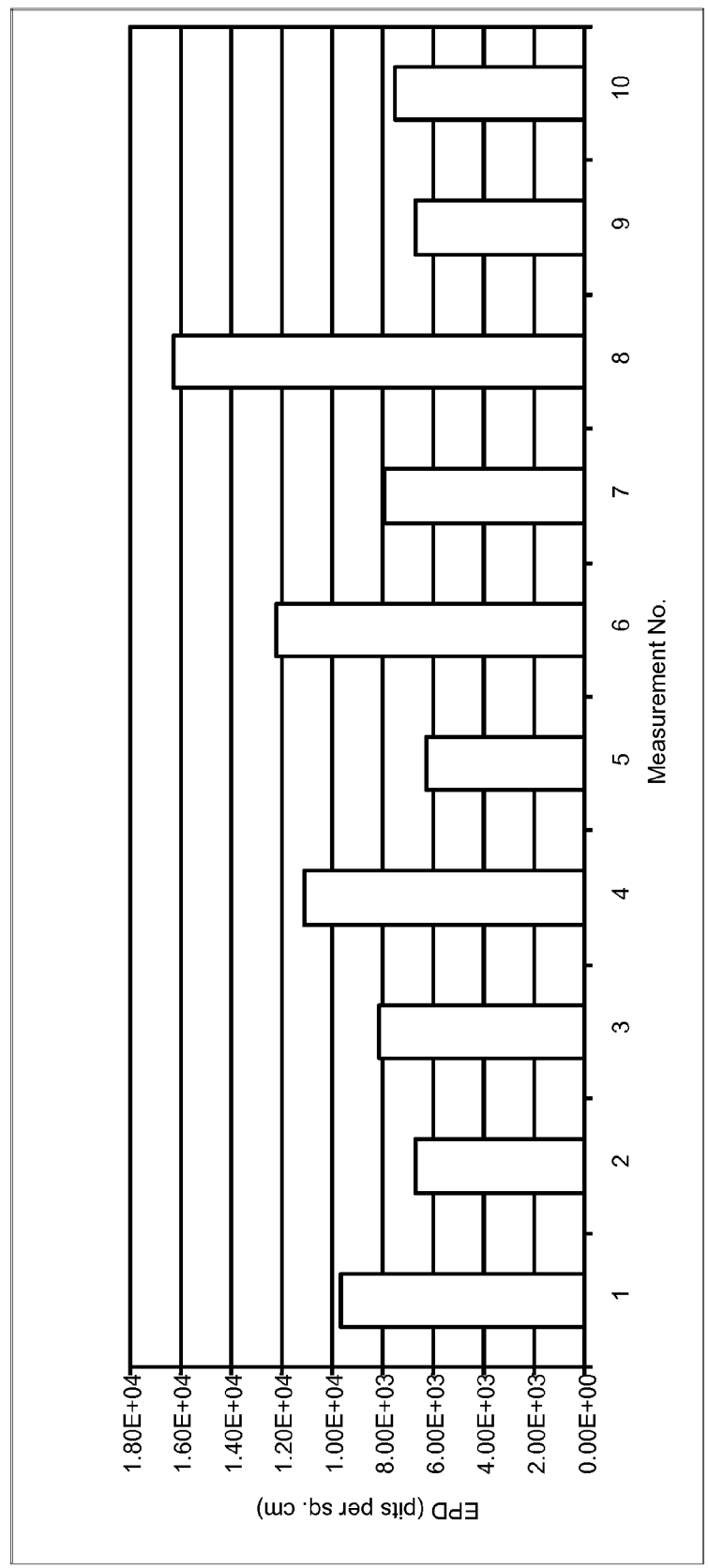
FIG. 23 plots the etch pit density measured at 10 different locations in the composition-controlled detached CdZnTe crystal.

The etch pit density (EPD) is measured at ten different locations in the 51-mm diameter CdZnTe crystal (shown in FIG. 15) and is plotted in FIG. 23. The average measured etch pit density of about $9 \times 10^3$ pits/cm$^2$ is at least an order of magnitude lower than the etch pit density in a commercially available infra-red substrate produced by Nikko Materials of Japan.

As noted above, an additional photographic image of a composition-controlled detached crystal produced via these methods are provided in FIG. 15, where a very large portion of the crystal constitutes a single grain. This image as well as the others shown earlier demonstrate that these crystals have a much higher single crystal yield (i.e., the single crystal grains are larger) than conventionally grown crystals, where achievement of a high single crystal yield is a major problem with CdZnTe. Elimination of ampoule-crystal contact and achieving appropriate melt stoichiometry are the driving factors in producing crystals with large single grains.

Figure 24:
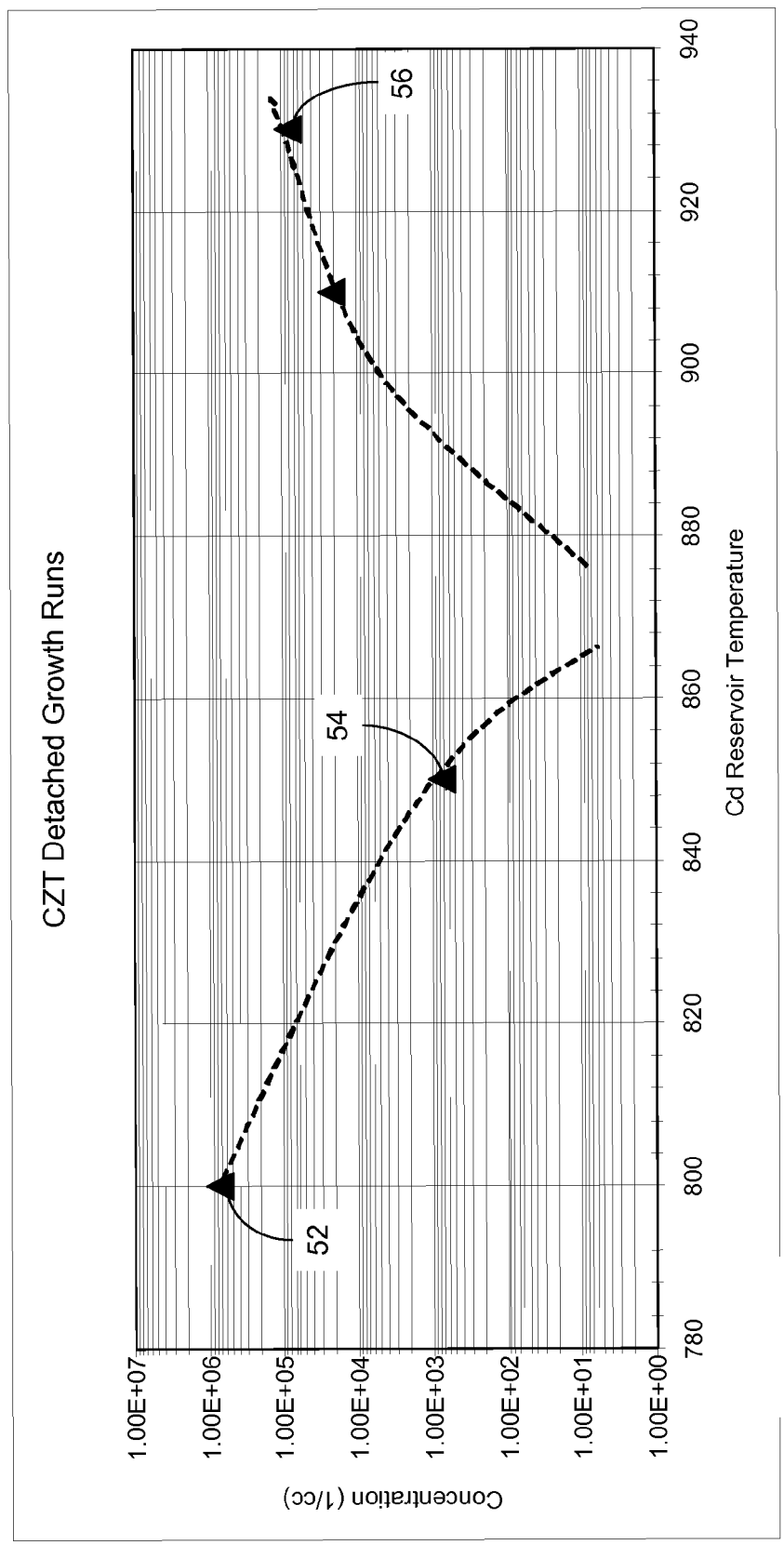
FIG. 24 is a plot of the volumetric concentration of tellurium precipitates in the crystals grown by the composition-controlled detached Bridgman method versus the pressure of cadmium in the lower reservoir.
Figure 25:
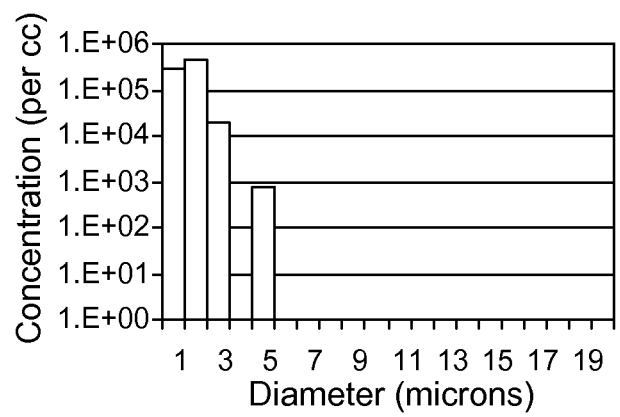
FIGS. 25-27 chart the diameter distribution of tellurium precipitates for crystals grown at the cadmium reservoir conditions plotted at points 52, 54 and 56, respectively, in FIG. 24.
Figure 26:
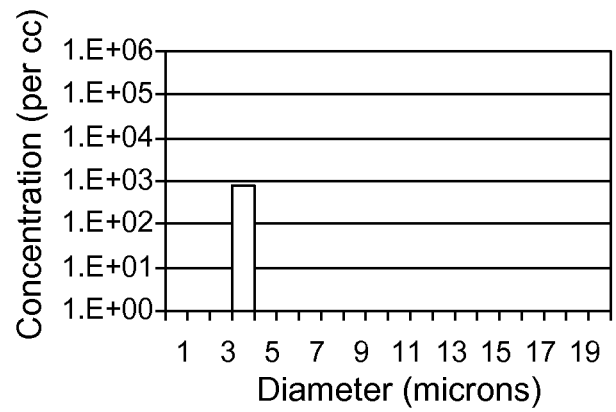
Figure 27:
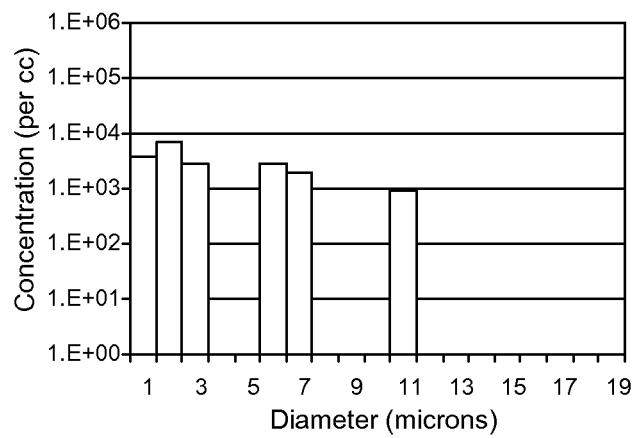

A plot of the volumetric concentration of tellurium precipitates in the crystals grown by the composition-controlled detached Bridgman method of this disclosure versus the temperature of cadmium in the lower reservoir is provided in FIG. 24. These measurements were made at five different locations for each crystal using an infra-red microscope, and the diameter distribution of the precipitates for crystals grown at the cadmium reservoir conditions plotted at points 52, 54 and 56 in FIG. 24 are respectively plotted in FIGS. 25, 26 and 27. These results clearly show that controlling the cadmium-source temperature can significantly reduce the number and volume of tellurium precipitates in the CdZnTe crystal.

Figure 28:
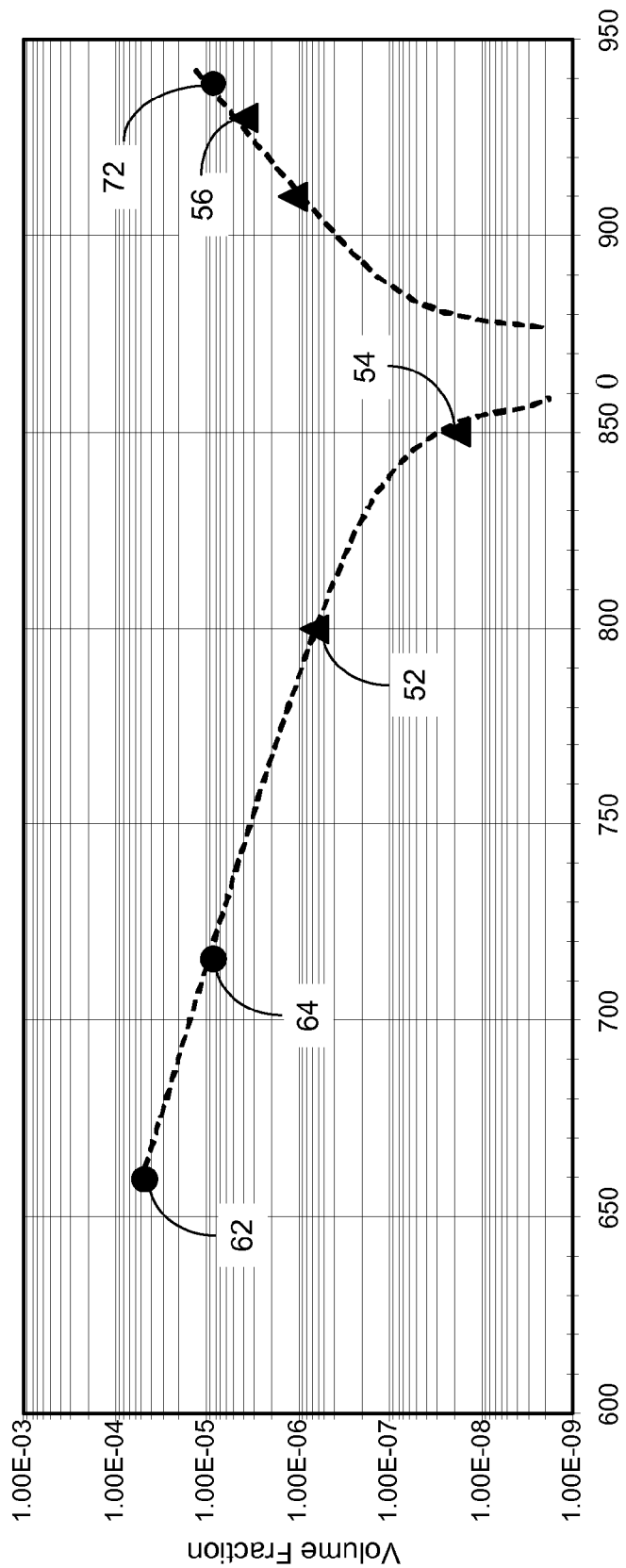
FIG. 28 plots the volumetric fraction of tellurium precipitates as a function of excess tellurium in the composition-controlled detached Bridgman crystals (shown with triangles) with crystals grown by standard Bridgman (shown with circles); plots to the left of 0 are p-type semiconductors, while plots to the right of 0 are n-type semiconductors.
Figure 29:
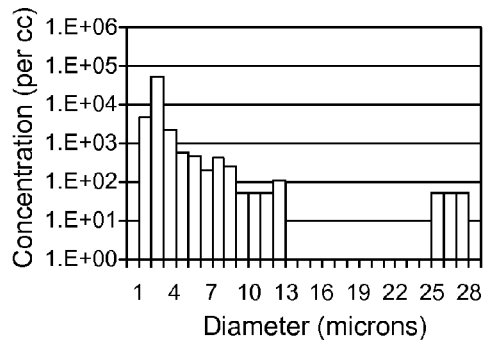
FIGS. 29-34 chart the diameter distribution of tellurium precipitates in crystals grown with the excess tellurium values plotted at points 62, 64, 52, 54, 56 and 72, respectively, in FIG. 28.
Figure 30:
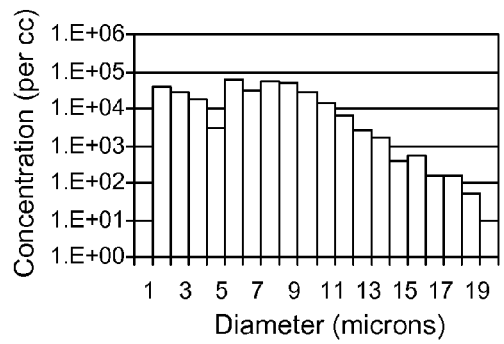
Figure 31:
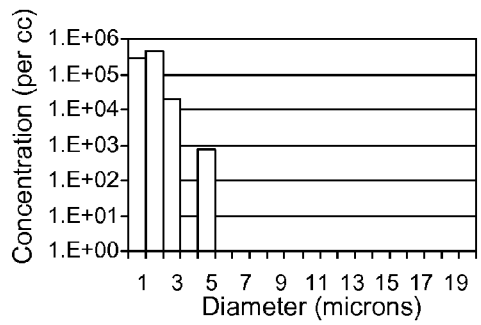
Figure 32:
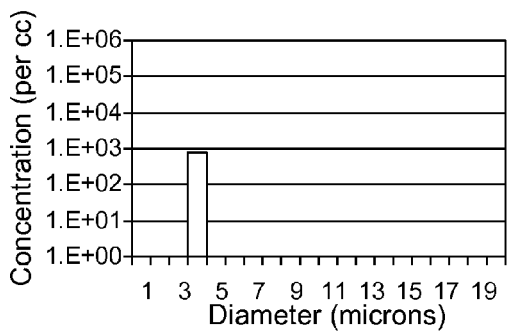
Figure 33:
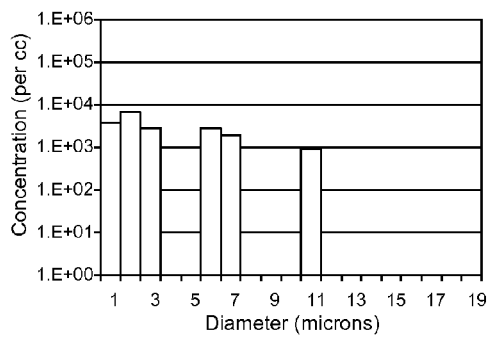
Figure 34:
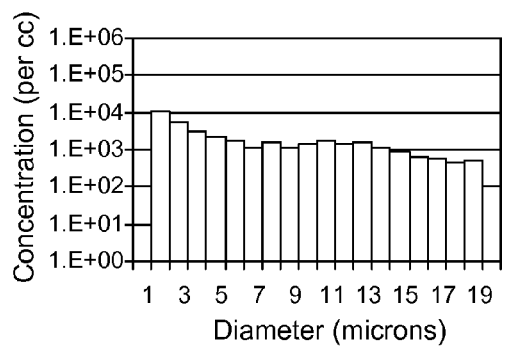

In FIG. 28, a plot of the volumetric fraction of tellurium precipitates as a function of excess tellurium in the crystals grown by the composition-controlled detached Bridgman method described herein is shown with triangles 52, 54 and 56, while crystals grown by a standard Bridgman method are shown with circles 62, 64 and 72; plots to the left of 0 (referenced on the horizontal axis) are p-type semiconductors, while plots to the right of 0 are n-type semiconductors. These measurements were made at five different locations for each crystal. The diameter distribution of tellurium precipitates in crystals grown with the excess tellurium values plotted at point 62 are shown in FIG. 29; meanwhile, the corresponding distributions for the following points are shown in the following Figures: the distribution for point 64 is shown in FIG. 30; the distribution for point 66 is shown in FIG. 31; the distribution for point 68 shown is in FIG. 32; the distribution for point 70 is shown in FIG. 33; and the distribution for point 72 is shown in FIG. 34.

The inventors have practiced this invention and have grown a number of CdZnTe crystals with the methods described here. These crystals have exhibited low dislocation density, as low as 1,000 per sq. cm, fairly high single crystal yield, and with tellurium precipitates with diameters no larger than 2 microns and with a tellurium number density of 1000 per cubic cm and tellurium-precipitate volumetric fraction less than $1 \times 10^{-8}$. These material properties are orders of magnitude better than those in commercially available CdZnTe substrates.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, $1/2$, $3/4^{th}$, etc. (or up by a factor of 2, 5, 10, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references optionally may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for solidifying an alloy semiconductor, comprising:
    using a container that includes a lower section and an upper section, wherein a solid charge is contained in the upper section and a composition-control source material is contained in the lower section, and wherein vapor from the source material can pass from the lower section to the upper section;
    heating the solid charge to form a melt and to form a melt meniscus extending from a lower surface of the melt to an inner surface of the container, the melt meniscus being in fluid communication with the lower section of the container;
    releasing a vapor from the composition-control source material and allowing the vapor to flow from the lower section to the upper section, the vapor contacting the melt meniscus and diffusing into the melt; and
    cooling the melt to progressively crystallize the melt with an upwardly advancing solidification front that interfaces with the melt meniscus, wherein the melt meniscus advances upwardly with the solidification front, wherein the vapor from the composition-control source material continues to contact the upwardly advancing melt meniscus as the melt is progressively crystallized, and wherein the contact of the vapor from the composition-control source material with the melt meniscus affects the composition of the crystal formed at the solidification front.

2. The method of claim 1, wherein the vapor is released by heating the composition-control source material.

3. The method of claim 2, wherein the release of the vapor generates a pressure differential across the melt that initiates and maintains the melt meniscus.

4. The method of claim 3, further comprising supplying an inert gas that, together with the vapor from the composition-control source material, generates the pressure differential across the melt that initiates and maintains the melt meniscus.

5. The method of claim 4, wherein the inert gas is supplied with a mechanically driven system.

6. The method of claim 2, wherein the solid charge, the melt and the composition-control source material are heated in a furnace having an axial temperature gradient.

7. The method of claim 6, further comprising displacing the container in the furnace to control the temperature of the solid charge and the melt and to control crystallization.

8. The method of claim 7, wherein the furnace includes:
a hot zone heated to a temperature above the melting point of the solid charge, wherein the solid charge is maintained in the hot zone as the melt is formed;
a post-growth zone heated to a temperature below the melting point of the solid charge, wherein the solid charge is moved into the post-growth zone during crystallization; and
a reservoir zone heated to a temperature lower than the temperature to which the post-growth zone is heated, wherein the composition-control source material is contained in the reservoir zone during crystallization.

9. The method of claim 8, further comprising setting the temperature of the reservoir zone to a temperature that results in the formed crystal being either a p-type or n-type semiconductor.

10. The method of claim 8, further comprising controlling the temperature of the reservoir zone to release vapor from the composition-control source material during annealing after completion of crystal growth to limit formation and size of second-phase materials in the grown crystal.

11. The method of claim 10, wherein the grown crystal comprises CdZnTe and the second-phase material is tellurium.

12. The method of claim 8, wherein the melt crystallizes along a growth interface, and the furnace further includes an eddy current sensor, the method further comprising using the eddy current sensor to detect the location of the growth interface and reducing the temperature of the lower section of the container as the growth interface advances to maintain detached growth of the crystal.

13. The method of claim 1, wherein a detachment gap separates the formed crystal from an interior wall surface of the container, and wherein the vapor flows through the detachment gap to the melt meniscus to produce a crystal having substantially consistent stoichiometry.

14. The method of claim 1, wherein the solid charge comprises an alloy of group II and VI elements.

15. The method of claim 1, wherein the solid charge comprises a cadmium-zinc-tellurium (CdZnTe) alloy.

16. The method of claim 15, wherein the vapor is selected from at least one of cadmium and zinc; and the composition-control source material includes at least one solid selected from cadmium, compounds of cadmium, zinc, and compounds of zinc.

17. The method of claim 16, wherein the vapor further comprises a dopant that alters the electrical, mechanical and optical properties of the grown crystal.

18. The method of claim 16, wherein the vapor further comprises a dopant that increases the electrical resistivity of the grown crystal by compensating impurities or intrinsic defects in the crystal.

19. The method of claim 18, wherein the dopant is selected from indium, chlorine, aluminum, iron and vanadium.

20. The method of claim 1, wherein a seed or graphite disk is contained in the upper section of the container, and the crystal is grown from the melt above the seed or graphite disk.

21. The method of claim 20, wherein the seed or graphite disk includes at least one groove on its perimeter and the vapor flows through the groove.

22. The method of claim 1, wherein the solid charge is mounted above a cone, and the melt flows into the cone before crystallization.

23. The method of claim 1, wherein the solid charge is
an alloy comprising a plurality of materials, wherein
the composition-control source material comprises at least one of the plurality of materials in the alloy charge.

24. The method of claim 23, wherein the alloy charge comprises elements selected from (a) groups III and V or (b) groups II and VI of the periodic table.

25. The method of claim 23, wherein the alloy charge comprises a cadmium-zinc-tellurium (CdZnTe) alloy.

26. The method of claim 25, wherein the composition-control source material comprises at least one element selected from cadmium, as cadmium metal or as a cadmium alloy, and zinc, as zinc metal or as a zinc alloy.

27. The method of claim 23, wherein a partial barrier is positioned in the container between the alloy charge and the composition-control source material, and wherein the partial barrier has a perimeter and at least one passage defined along the perimeter of the partial barrier.

28. The method of claim 27, wherein the partial barrier is a seed or a graphite disk that serves as a nucleus for growth of the crystal from the alloy charge.

* * * * *